US008493142B2

(12) United States Patent
Tadano

(10) Patent No.: US 8,493,142 B2
(45) Date of Patent: Jul. 23, 2013

(54) AMPLIFIER, TRANSMISSION DEVICE, AND AMPLIFIER CONTROL METHOD

(75) Inventor: Tsuneaki Tadano, Sendai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/421,148

(22) Filed: Mar. 15, 2012

(65) Prior Publication Data
US 2012/0293255 A1 Nov. 22, 2012

(30) Foreign Application Priority Data

May 16, 2011 (JP) ................................. 2011-109826

(51) Int. Cl.
H03G 3/20 (2006.01)
(52) U.S. Cl.
USPC ............ 330/136; 330/127; 330/296; 330/297
(58) Field of Classification Search
USPC .................. 330/136, 127, 296, 297
See application file for complete search history.

(56) References Cited

U.S. PATENT DOCUMENTS

| 5,422,598 A * | 6/1995 | Maeda et al. ................. 330/136 |
| 6,831,517 B1 * | 12/2004 | Hedberg et al. ............... 330/285 |
| 7,068,096 B2 * | 6/2006 | Chu ................................. 330/10 |
| 7,339,426 B2 * | 3/2008 | Gurvich et al. ............... 330/136 |
| 8,030,995 B2 * | 10/2011 | Okubo et al. .................. 330/127 |
| 8,237,499 B2 * | 8/2012 | Chen et al. .................... 330/136 |
| 2009/0191826 A1 * | 7/2009 | Takinami et al. ............. 455/110 |
| 2012/0194274 A1 * | 8/2012 | Fowers et al. ................. 330/293 |

FOREIGN PATENT DOCUMENTS

| JP | 62-277806 | 12/1987 |
| JP | 2002-374128 | 12/2002 |
| JP | 2009-10484 | 1/2009 |

* cited by examiner

Primary Examiner — Patricia Nguyen
(74) Attorney, Agent, or Firm — Fujitsu Patent Center

(57) ABSTRACT

An amplifier includes an envelope detection unit that detects an envelope of a transmission signal; a comparing unit that compares a voltage of the envelope with a reference voltage; a selecting unit that selects, in accordance with a comparison result obtained by the comparing unit, an amplifying element that amplifies the transmission signal from among a plurality of amplifying elements each having different operating power; a voltage control unit that controls, in accordance with the envelope, a voltage that is used to amplify the transmission signal in the amplifying element that is selected by the selecting unit; a current measuring unit that measures a current of a power supply that supplies the voltage that is controlled by the voltage control unit; and a reference voltage control unit that controls the reference voltage such that the current measured by the current measuring unit decreases.

6 Claims, 8 Drawing Sheets

AMPLIFIER, TRANSMISSION DEVICE, AND AMPLIFIER CONTROL METHOD

CROSS-REFERENCE TO RELATED APPLICATION

This application is based upon and claims the benefit of priority of the prior Japanese Patent Application No. 2011-109826, filed on May 16, 2011, the entire contents of which are incorporated herein by reference.

FIELD

The embodiment discussed herein is directed to an amplifier, a transmission device, and an amplifier control method.

BACKGROUND

An envelope tracking (ET) system is known as a technology for improving the electrical power efficiency of amplifiers used in transmission devices, such as mobile terminals or radio relay devices. The envelope tracking system is a technology for controlling a drain voltage in accordance with the variation in the envelope curve of a transmission signal (hereinafter, referred to as an "envelope"). The envelope tracking system can allow amplifiers to be operated in a state close to saturation, and thus it is possible for the amplifiers to be operated with high efficiency.

However, in the envelope tracking system, because drain voltage varies, the output impedance of an amplifier is inconsistent with the impedance of the output load, thus causing the power efficiency of the amplifier to be reduced. In particular, if the amplifier is operated at a low power output, the power efficiency of the amplifier drops to the lowest efficiency.

FIG. 8 is a schematic diagram illustrating a power efficiency curve of a commonly used amplifier that uses an envelope tracking system. The horizontal axis in FIG. 8 indicates output power [dBm] and the vertical axis in FIG. 8 indicates power efficiency [%]. As indicated by a curve 300 illustrated in FIG. 8, the power efficiency of the amplifier that uses the envelope tracking system is reduced as the output power is reduced in accordance with the drop in the drain voltage. Specifically, if the amplifier is operated at a low power output, the power efficiency of the amplifier drops to the lowest efficiency.

Accordingly, various kinds of amplifiers have been proposed whose power efficiency obtained when the amplifiers are operated at a low power output is improved. For example, with conventional amplifiers, two amplifying elements having different operating power are connected in parallel and these two amplifying elements are selectively operated in accordance with the voltage of an envelope of a transmission signal.

Specifically, a conventional amplifier detects the envelope of the transmission signal. Then, the amplifier compares the voltage of the envelope with a predetermined reference voltage. Thereafter, in accordance with the comparison result of the voltage of the envelope and the predetermined reference voltage, the amplifier selects, from the two amplifying elements, an amplifying element that amplifies the transmission signal. Then, the amplifier controls, in accordance with the envelope, the drain voltage of the selected amplifying element. Accordingly, if the voltage of the envelope is equal to or greater than the reference voltage, the amplifier can allow the amplifying element whose operating power is relatively high to be operated, whereas, if the voltage of the envelope is lower than the reference voltage, the amplifier can allow the amplifying element whose amplifying element is relatively low to be operated. Consequently, it is possible to improve the power efficiency of the amplifier when it is operated at a low power output.

FIG. 9 is a schematic diagram illustrating a power efficiency curve of a conventional amplifier that selectively operates two amplifying elements in accordance with the voltage of the envelope of the transmission signal. The horizontal axis in FIG. 9 indicates output power [dBm] and the vertical axis in FIG. 9 indicates power efficiency [%]. A straight line 301 indicated by the broken line illustrated in FIG. 9 indicates the output power obtained when the voltage of the envelope becomes the predetermined reference voltage. As indicated by a curve 302 illustrated in FIG. 9, if the voltage of the envelope is equal to or greater than the reference voltage, the amplifying element whose operating power is relatively high is operated; therefore, the power efficiency is kept in a high state. In contrast, as indicated by a curve 303 illustrated in FIG. 9, if the voltage of the envelope is lower than the reference voltage, the amplifying element whose operating power is relatively low is operated; therefore, the power efficiency is also kept in a high state.

Patent Document 1: Japanese Laid-open Patent Publication No. 2002-374128

Patent Document 2: Japanese Laid-open Patent Publication No. 62-277806

Patent Document 3: Japanese Laid-open Patent Publication No. 2009-10484

However, with the conventional technology, there is a problem in that the power efficiency is degraded due to the variation in the environment in which the amplifier is being used, such as a temperature change or a variation in accuracy of parts.

For example, there may be a case in which, due to a temperature change, an excessive drain current is output from a power supply that supplies the drain voltage and thus the efficiency curve of the amplifier may be shifted. With the conventional technology described above, even if the efficiency curve of the amplifier is shifted, the reference voltage that is used to compare the voltage of the envelope is still fixed; therefore, the power efficiency may possibly significantly drop. It is assumed, for example, that the power efficiency of the amplifying element indicated by the curve 302 illustrated in FIG. 9 is shifted to a curve 302a illustrated in FIG. 9 due to a temperature change. In such a case, the power efficiency with respect to the output power when the voltage of the envelope becomes the predetermined reference voltage indicated by the straight line 301 significantly drops, as indicated by an arrow 304. Accordingly, with the conventional technology described above, the power efficiency may possibly drop due to the variation in the environment in which the amplifier is being used, such as a temperature change or a variation in the accuracy of parts.

SUMMARY

According to an aspect of an embodiment of the invention, an amplifier includes an envelope detection unit that detects an envelope of a transmission signal; a comparing unit that compares a voltage of the envelope with a reference voltage; a selecting unit that selects, in accordance with a comparison result obtained by the comparing unit, an amplifying element that amplifies the transmission signal from among a plurality of amplifying elements each having different operating power; a voltage control unit that controls, in accordance with the envelope, a voltage that is used to amplify the transmission signal in the amplifying element that is selected by the selecting unit; a current measuring unit that measures a current of a power supply that supplies the voltage that is controlled by the voltage control unit; and a reference voltage control unit that controls the reference voltage such that the current measured by the current measuring unit decreases.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENT

Preferred embodiment of the present invention will be explained with reference to accompanying drawings.

The present invention is not limited to the embodiment.

Figure 1:
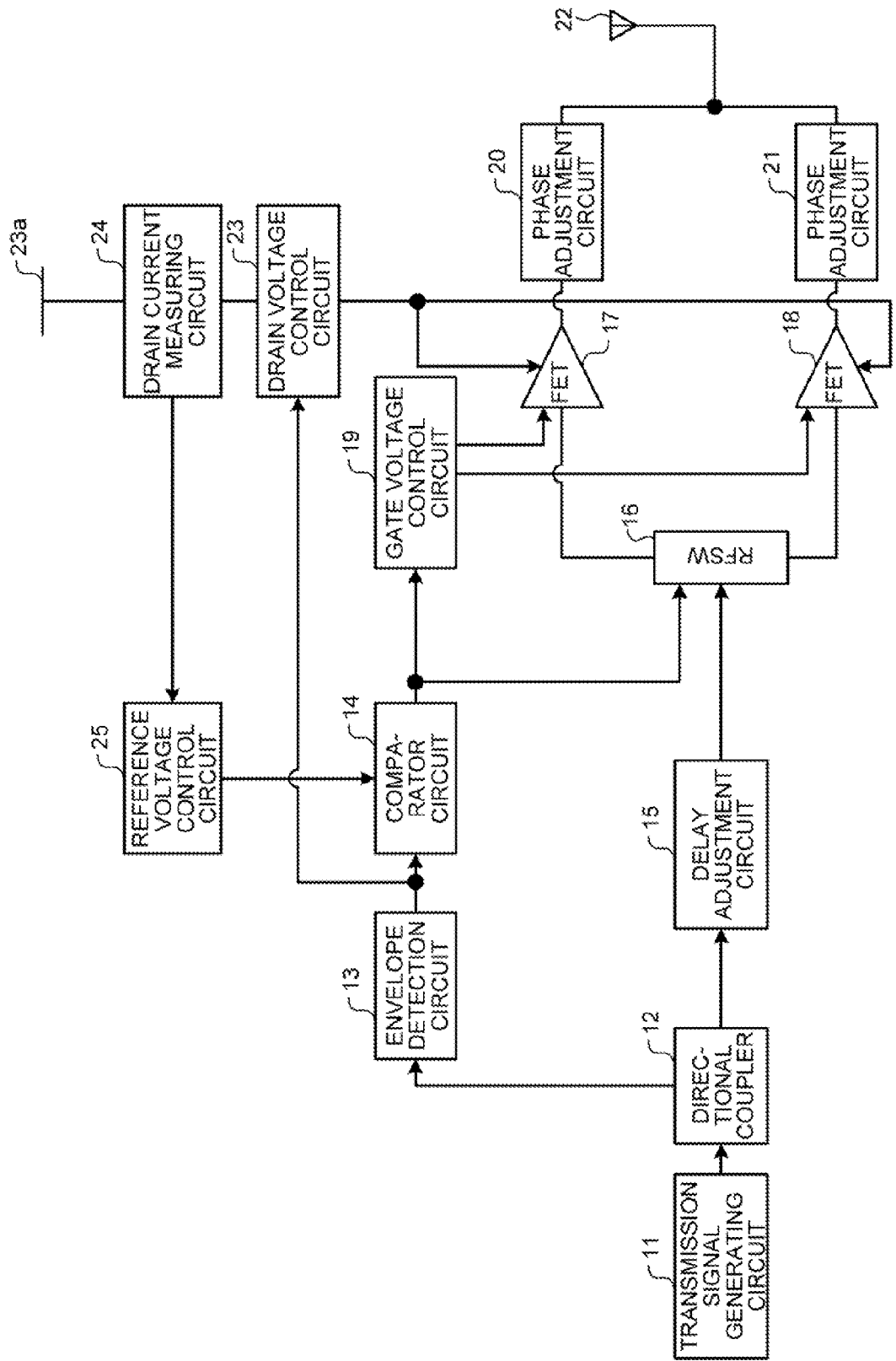
FIG. 1 is a block diagram illustrating a transmission device according to an embodiment of the present invention.

FIG. 1 is a block diagram illustrating a transmission device according to an embodiment of the present invention. As illustrated in FIG. 1, a transmission device according to an embodiment of the present invention includes a transmission signal generating circuit 11, a directional coupler 12, an envelope detection circuit 13, a comparator circuit 14, a delay adjustment circuit 15, a radio frequency switch (RFSW) 16, and field effect transistors (FET) 17 and FET 18. Furthermore, the transmission device also includes a gate voltage control circuit 19, a phase adjustment circuit 20, a phase adjustment circuit 21, an antenna 22, a drain voltage control circuit 23, a drain current measuring circuit 24, and a reference voltage control circuit 25.

The transmission signal generating circuit 11 generates, as a transmission signal, a radio frequency (RF) signal that contains the transmission content as data. The transmission signal generating circuit 11 outputs the generated RF signal to the directional coupler 12. The directional coupler 12 splits the RF signal received from the transmission signal generating circuit 11 and outputs it to the envelope detection circuit 13 and the delay adjustment circuit 15.

The envelope detection circuit 13 detects an envelope of the RF signal by performing envelope detection on the RF signal received from the transmission signal generating circuit 11. The value of the envelope detected by the envelope detection circuit 13 indicates the amplitude of the envelope obtained at a certain time. The envelope detection circuit 13 outputs the envelope of the RF signal to the comparator circuit 14 and the drain voltage control circuit 23.

The comparator circuit 14 compares the voltage of the envelope received from the envelope detection circuit 13 with the reference voltage that is the voltage set by the reference voltage control circuit 25 and outputs the comparison result to the RFSW 16 and the gate voltage control circuit 19. Specifically, if the voltage of the envelope is equal to or greater than the reference voltage, the comparator circuit 14 outputs, as the comparison result, a signal indicating that the FET 17 is to be selected to the RFSW 16 and the gate voltage control circuit 19. In contrast, if the voltage of the envelope is less than the reference voltage, the comparator circuit 14 outputs, as the comparison result, a signal indicating that the FET 18 is to be selected to the RFSW 16 and the gate voltage control circuit 19.

At this time, the value of the reference voltage is the optimum value that is dynamically controlled by the reference voltage control circuit 25 and is dynamically set by the reference voltage control circuit 25. Accordingly, by using the value of the reference voltage that is dynamically set (hereinafter, referred to as a "reference voltage setting value"), the comparator circuit 14 compares the voltage of the envelope with the reference voltage and outputs a comparison result indicating that either the FET 17 or the FET 18 is to be selected.

The delay adjustment circuit 15 obtains the RF signal that is received from the directional coupler 12. The delay adjustment circuit 15 delays the RF signal by the time corresponding to the processing time performed by the envelope detection circuit 13 and the comparator circuit 14 and then outputs the delayed RF signal to the RFSW 16.

The RFSW 16 obtains the RF signal that is received from the delay adjustment circuit 15. The RFSW 16 also obtains the comparison result received from the comparator circuit 14. The RFSW 16 selects, from the FET 17 and the FET 18 in accordance with the comparison result, an amplifying element that amplifies the RF signal. Specifically, if the RFSW 16 obtains, as the comparison result, the signal indicating that the FET 17 is to be selected, the RFSW 16 selects the FET 17 by sending, to an internal switching element, the signal indicating that the RF signal is to be transmitted to the path connected to the FET 17. In contrast, the RFSW 16 selects the FET 18 by sending, to an internal switching element, the signal indicating that the RF signal is to be transmitted to the path connected to the FET 18. The RFSW 16 is an example of a selecting unit.

The FET 17 and the FET 18 are amplifying elements that each have a different operating power and are connected in parallel with respect to the RFSW 16. In this embodiment, the operating power of the FET 17 is greater than that of the FET 18. In other words, the peak of the output power in the efficiency curve of the FET 17 is greater than that of the FET 18.

The FET 17 and the FET 18 obtain the RF signal that is input from the RFSW 16. By using the drain voltage controlled by the drain voltage control circuit 23, the FET 17 and the FET 18 amplify the RF signal. The FET 17 and the FET 18 each output the amplified RF signal to the phase adjustment circuit 20 and the phase adjustment circuit 21, respectively.

Furthermore, by using the gate voltage controlled by the gate voltage control circuit 19, the FET 17 and the FET 18 switch states between the operating state and the non-operating state.

The gate voltage control circuit 19 obtains the comparison result that is received from the comparator circuit 14. The gate voltage control circuit 19 supplies the gate voltage in accordance with the comparison result to the FET 17 and the FET 18. Specifically, if the gate voltage control circuit 19 receives, as a comparison result, a signal indicating that the FET 17 is to be selected, the gate voltage control circuit 19 supplies, to the FET 17 as a gate voltage, an Idsp voltage that operates the FET 17 selected by the RFSW 16. At the same time, the gate voltage control circuit 19 supplies, to the FET 18 as a gate voltage, a pinch off voltage that causes the FET 18 that is not selected by the RFSW 16 to not operate. In contrast, if the gate voltage control circuit 19 receives, as a comparison result, a signal indicating that the FET 18 is to be selected, the gate voltage control circuit 19 supplies, to the FET 18 as a gate voltage, the Idsp voltage that causes the FET 18 selected by the RFSW 16 to operate. At the same time, the gate voltage control circuit 19 supplies, to the FET 17 as a gate voltage, the pinch off voltage that causes the FET 17 that is not selected by the RFSW 16 to not operate. The gate voltage control circuit 19 is an example of an on-off voltage control unit. Furthermore, the gate voltage is an example of the voltage that operates the selected amplifying element and the voltage that causes an amplifying element other than the selected amplifying element to not operate.

The phase adjustment circuit 20 and the phase adjustment circuit 21 obtain the RF signals received from the FET 17 and the FET 18, respectively. The phase adjustment circuit 20 adjust the phase of the RF signal obtained from the FET 17 such that the output impedance of the FET 17, which is caused by the gate voltage control circuit 19 to not operate, is open with respect to the FET 18, which is caused by the gate voltage control circuit 19 to operate. The phase adjustment circuit 21 adjusts the phase of the RF signal obtained from the FET 18 such that the output impedance of the FET 18, which is made to not operate by the gate voltage control circuit 19, is made to be opened with respect to the FET 17 that is operated by the gate voltage control circuit 19. The RF signal whose phase is adjusted by the phase adjustment circuit 20 or the phase adjustment circuit 21 is sent outside via the antenna 22.

In the following, specific processes performed by the comparator circuit 14, the RFSW 16, the gate voltage control circuit 19, the phase adjustment circuit 20, and the phase adjustment circuit 21 will be specifically described. A specific example of a process performed when the voltage of an envelope is equal to or greater than the reference voltage will be described first. Then, a specific example of a process performed when the voltage of an envelope is less than the reference voltage will be described.

Figure 2:
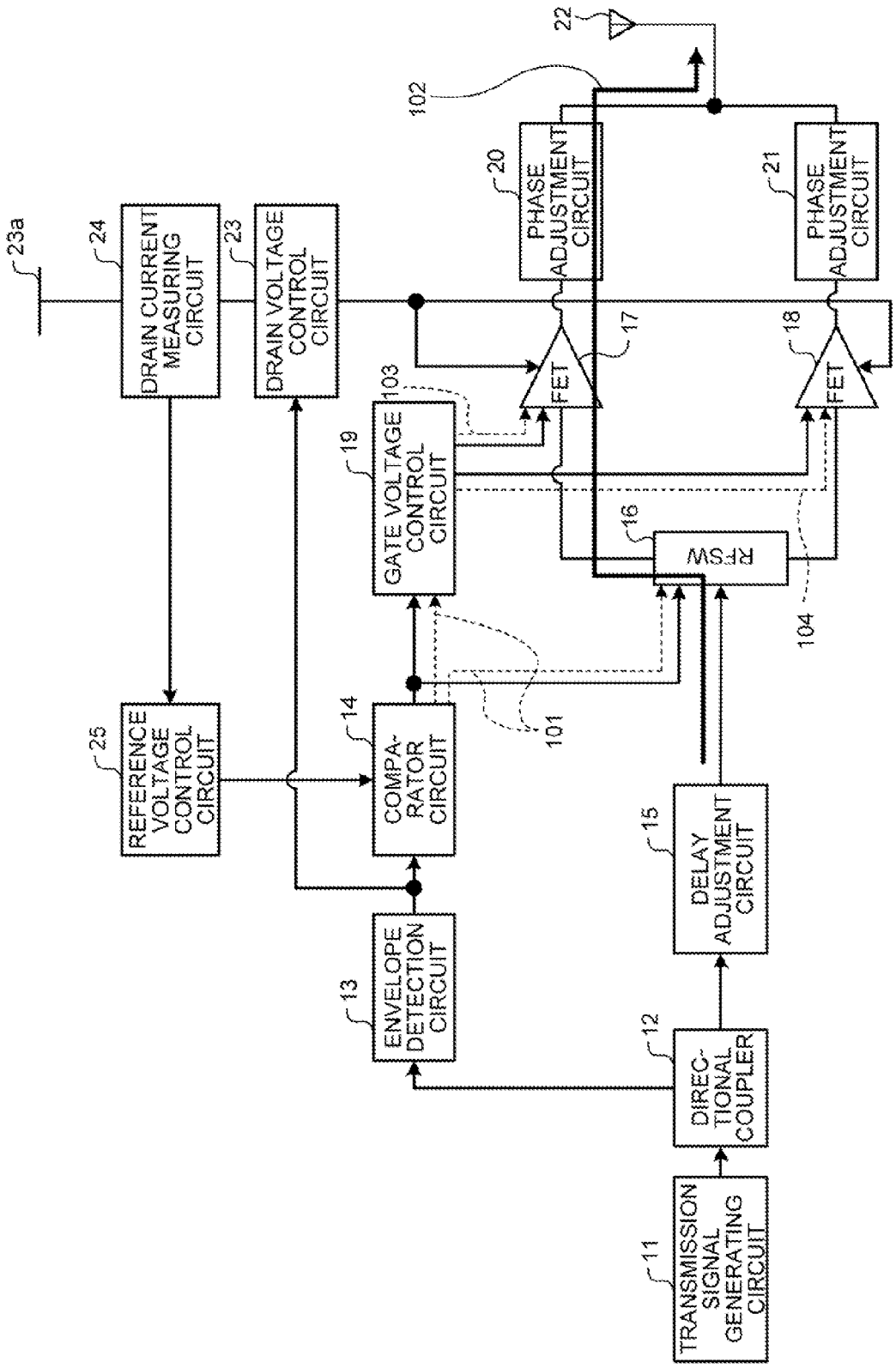
FIG. 2 is a schematic diagram illustrating a path of an RF signal when the voltage of an envelope is equal to or greater than a reference voltage.

First, a process will be specifically described that is performed, when the voltage of the envelope is equal to or greater than the reference voltage, by the comparator circuit 14, the RFSW 16, the gate voltage control circuit 19, the phase adjustment circuit 20, and the phase adjustment circuit 21. FIG. 2 is a schematic diagram illustrating the path of an RF signal when the voltage of an envelope is equal to or greater than a reference voltage. First, because the voltage of the envelope is equal to or greater than the reference voltage, the comparator circuit 14 outputs, as the comparison result to the RFSW 16 and the gate voltage control circuit 19, a signal 101 indicating that the FET 17 is to be selected. Then, if the RFSW 16 receives the signal 101 indicating that the FET 17 is to be selected, the RFSW 16 selects the FET 17 by transmitting, to an internal switching element, a signal indicating that the RF signal is to be sent to the path connected to the FET 17. Accordingly, the RF signal passes along the path indicated by a thick arrow 102.

If the gate voltage control circuit 19 obtains the signal 101 indicating that the FET 17 is to be selected, the gate voltage control circuit 19 supplies, to the FET 17, an Idsp voltage 103 as the gate voltage that causes the FET 17 selected by the RFSW 16 to operate. At the same time, the gate voltage control circuit 19 supplies, to the FET 18, a pinch off voltage 104 as the gate voltage that causes the FET 18 that is not selected by the RFSW 16 to not operate. Accordingly, the FET 18 is not being operated, and thus the electrical power consumed by the FET 18 is reduced.

Figure 3:
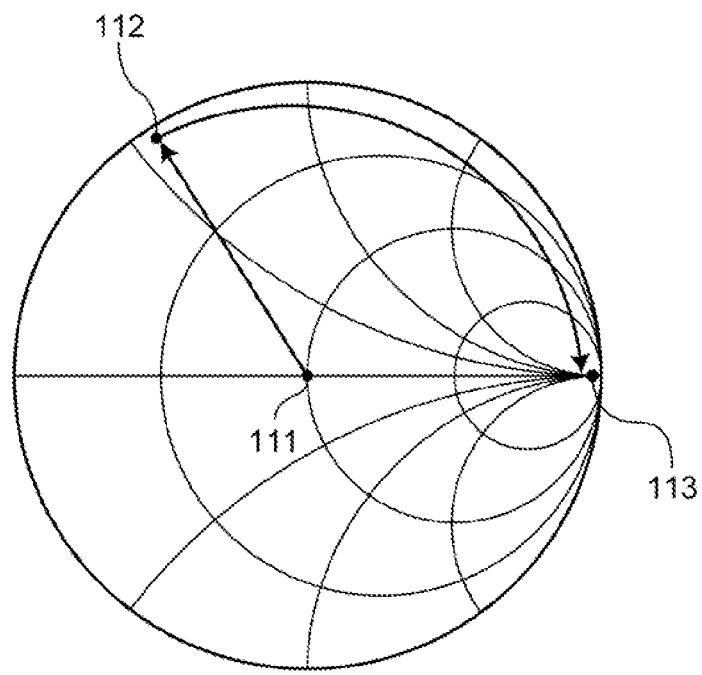
FIG. 3 is a schematic diagram illustrating phase adjustment performed by a phase adjustment circuit.

At this time, if the FET 18 is not being operated, the output impedance of the FET 18 increases from a center point 111 of the Smith chart toward a point 112 on the outer circumference of the Smith chart, as illustrated in FIG. 3. However, the value of the output impedance of the FET 18 that increases to the point 112 may possibly be shifted from an open point 113, at which the value is infinite. Accordingly, the phase adjustment circuit 21 adjusts the phase of the RF signal that is output from the FET 18 such that the output impedance of the FET 18 is opened with respect to the FET 17. In the example illustrated in FIG. 3, the phase adjustment circuit 21 adjusts the phase of the RF signal that is output from the FET 18 by rotating the phase of the RF signal that is increased to the point 112 until the RF signal reaches the open point 113. Accordingly, because the output impedance of the FET 18 that is not being operated is open with respect to the FET 17 that is being operated, it is possible to prevent the RF signal from leaking from the FET 17 to the FET 18. FIG. 3 is a schematic diagram illustrating phase adjustment performed by the phase adjustment circuit 21.

Figure 4:
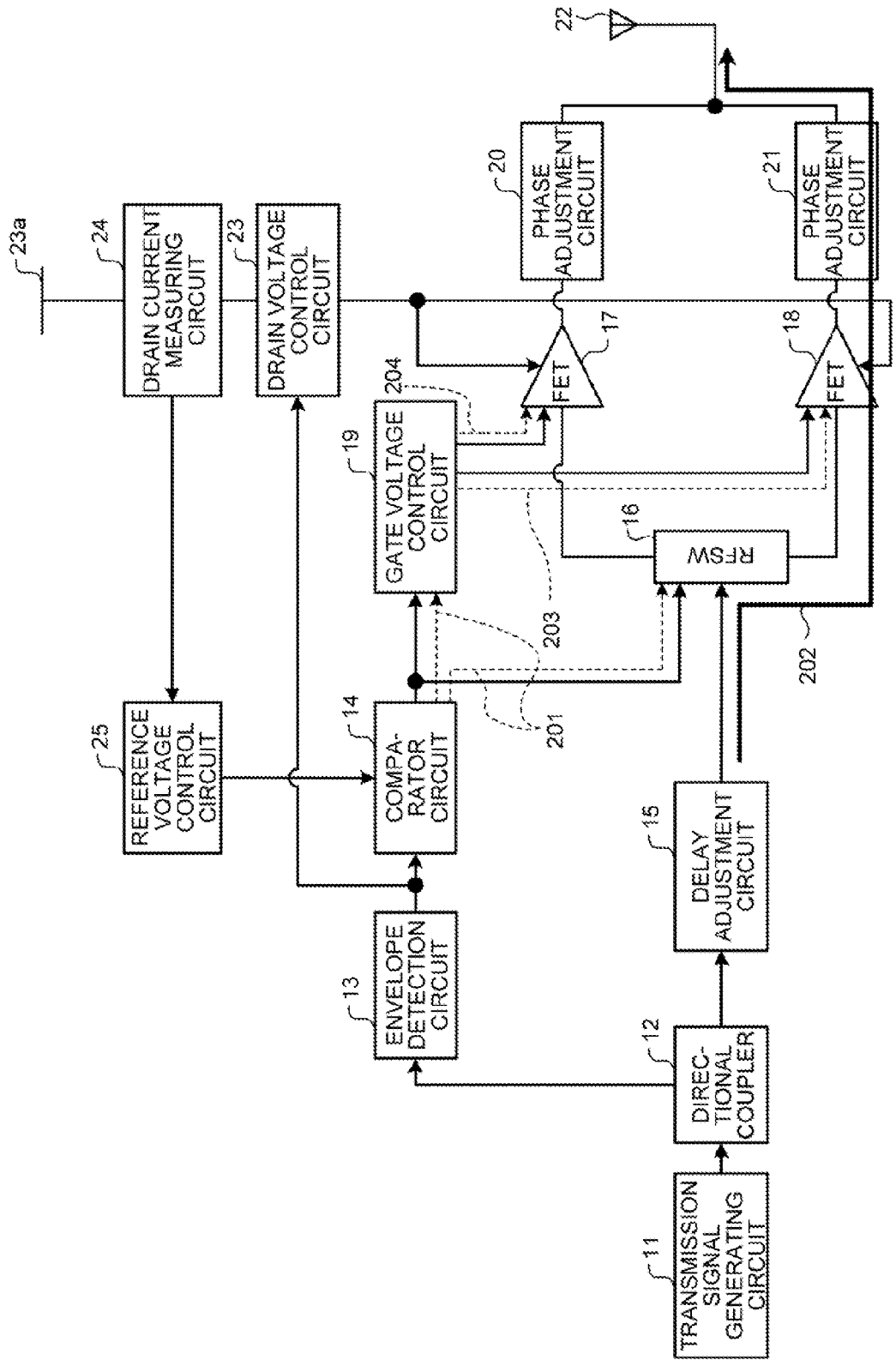
FIG. 4 is a schematic diagram illustrating a path of an RF signal when the voltage of an envelope is less than the reference voltage.

In the following, a process will be specifically described that is performed, when the voltage of the envelope is less than the reference voltage, by the comparator circuit 14, the RFSW 16, the gate voltage control circuit 19, the phase adjustment circuit 20, and the phase adjustment circuit 21. FIG. 4 is a schematic diagram illustrating a path of an RF signal when a voltage of an envelope is less than the reference voltage. First, because the voltage of the envelope is less than the reference voltage, the comparator circuit 14 outputs, as the comparison result to the RFSW 16 and the gate voltage control circuit 19, a signal 201 indicating that the FET 18 is to be selected. Then, if the RFSW 16 receives the signal 201 indicating that the FET 18 is to be selected, the RFSW 16 selects the FET 18 by transmitting, to an internal switching element, a signal indicating that the RF signal is to be sent to the path connected to the FET 18. Accordingly, the RF signal passes along the path indicated by a thick arrow 202.

If the gate voltage control circuit 19 obtains the signal 201 indicating that the FET 18 is to be selected, the gate voltage control circuit 19 supplies, to the FET 18, an Idsp voltage 203 as the gate voltage that causes the FET 18 that is selected by the RFSW 16 to operate. At the same time, the gate voltage control circuit 19 supplies, to the FET 17, a pinch off voltage 204 as the gate voltage that causes the FET 17 that is not selected by the RFSW 16 to not operate. Accordingly, the FET 17 is not being operated, and thus the electrical power consumed by the FET 17 is reduced.

At this time, if the FET 17 is not being operated, the output impedance of the FET 17 increases from the center point of the Smith chart toward the point on the outer circumference of the Smith chart. Accordingly, in a same manner as with the phase adjustment circuit 21 described with reference to FIG.

3, the phase adjustment circuit 20 adjusts the phase of the RF signal that is output from the FET 17 such that the output impedance of the FET 17 is open with respect to the FET 18. Accordingly, because the output impedance of the FET 17 that is not being operated is open with respect to the FET 18 that is being operated, it is possible to prevent the RF signal from leaking from the FET 17 to the FET 18.

Referring back to FIG. 1, the drain voltage control circuit 23 obtains the envelope that is input from the envelope detection circuit 13. The drain voltage control circuit 23 obtains the voltage supplied from a power supply 23a as the drain voltage of the FET 17 and the FET 18. The drain voltage control circuit 23 controls, in accordance with the envelope, the drain voltage of the FET 17 or the FET 18 that is selected by the RFSW 16. The drain voltage control circuit 23 is an example of a voltage control unit. The drain voltage is an example of the voltage that is used to amplify the transmission signal in the amplifying element.

The drain current measuring circuit 24 measures the drain current that is output from the power supply 23a that supplies the drain voltage. The drain current measuring circuit 24 is an example of a current measuring unit. The drain current is an example of the current of the power supply that supplies the voltage.

The reference voltage control circuit 25 obtains the drain current that is measured by the drain current measuring circuit 24. The reference voltage control circuit 25 controls the reference voltage that is set in the comparator circuit 14 such that the drain current measured by the drain current measuring circuit 24 is reduced.

If the FET 17 and the FET 18 are operated in the normal use environment, the drain current measured by the drain current measuring circuit 24 does not significantly vary. However, if the use environment varies, such as a temperature change occurs in the FET 17 and the FET 18 or a variation in the accuracy of parts, an excessive drain current is output from the power supply 23a and thus the drain current measured by the drain current measuring circuit 24 significantly varies. If the drain current varies, the efficiency curve is shifted and thus the power efficiency may possibly significantly drop. Accordingly, the reference voltage control circuit 25 controls the reference voltage of the comparator circuit 14 such that the drain current measured by the drain current measuring circuit 24 decreases. In this way, it is possible to dynamically search for an optimum reference voltage that suppresses an output of the excessive drain current; therefore, it is possible to reduce a drop in power efficiency due to the variation in the use environment.

Figure 5:
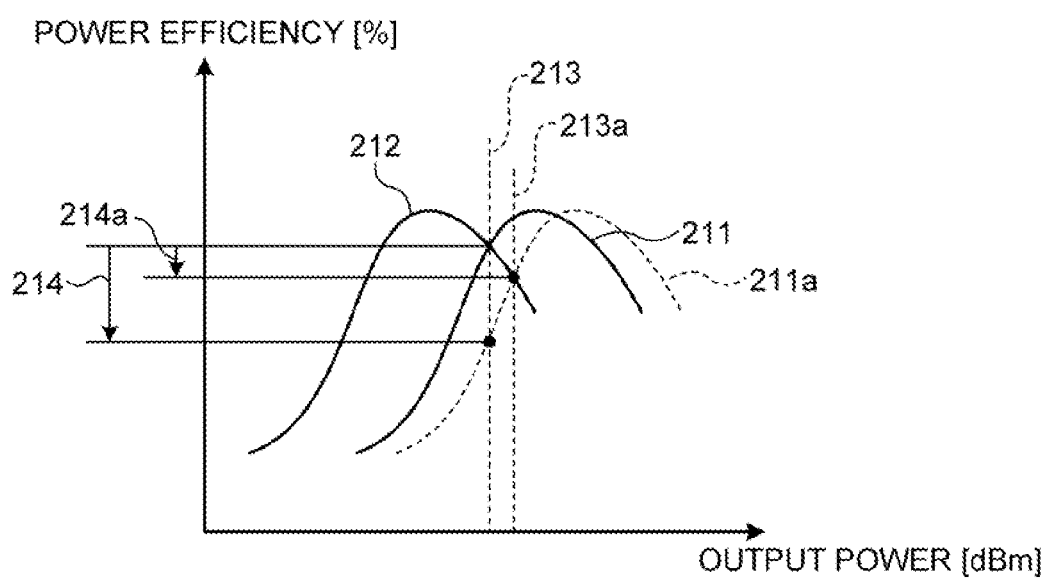
FIG. 5 is a schematic diagram illustrating a process performed by a reference voltage control circuit.

In the following, a process performed by the reference voltage control circuit 25 will be specifically described. FIG. 5 is a schematic diagram illustrating a process performed by the reference voltage control circuit 25. FIG. 5 illustrates the power efficiency curve of the transmission device according to the embodiment. The horizontal axis in FIG. 5 indicates output power [dBm] and the vertical axis in FIG. 5 indicates power efficiency [%]. In the following, a case will be described in which a temperature change occurs in the FET 17 as a variation in the use environment.

A curve 211 indicates the power efficiency of the FET 17. A curve 212 indicates the power efficiency of the FET 18. A broken straight line 213 indicates the output power obtained when the voltage of the envelope becomes the reference voltage. Because the envelope is equal to or greater than the reference voltage in the region on the right side of the straight line 213, the FET 17 is operated. In the region on the left side of the straight line 213, because the voltage of the envelope is less than the reference voltage, the FET 18 operates.

If the temperature of the FET 17 is changed, because an excessive drain current is output from the power supply 23a, as illustrated in FIG. 5, the power efficiency of the FET 17 indicated by the curve 211 is shifted to a curve 211a indicated by the broken line. In such a case, the power efficiency that is indicated by the straight line 213 and corresponds to the output power obtained when the voltage of the envelope becomes the reference voltage is significantly reduced as indicated by an arrow 214.

In this state, the reference voltage control circuit 25 detects a variation in the drain current that is measured by the drain current measuring circuit 24. For example, the reference voltage control circuit 25 periodically detects the drain current measured by the drain current measuring circuit 24 and detects, if the currently detected drain current is different from the previously detected drain current, the variation in the drain current. Furthermore, for example, if the currently detected drain current varies by 10% or more from the previous detected drain current, the reference voltage control circuit 25 detects the variation in the drain current.

The reference voltage control circuit 25 that detects the variation in the drain current sets a currently supplied reference voltage as the initial value of the reference voltage setting value. The currently supplied reference voltage mentioned here means the reference voltage that is currently supplied to the comparator circuit 14 by the reference voltage control circuit 25.

Subsequently, the reference voltage control circuit 25 adds a predetermined value ΔV to the initial value of the reference voltage setting value and sets the added reference voltage setting value to the comparator circuit 14.

Subsequently, the reference voltage control circuit 25 determines whether the drain current measured by the drain current measuring circuit 24 increases or decreases. If the drain current measured by the drain current measuring circuit 24 decreases, an excessive drain current that is output from the power supply 23a is reduced, which means that a drop in the power efficiency due to the variation in the use environment can be reduced. In contrast, if drain current measured by the drain current measuring circuit 24 increases, an excessive drain current is output from the power supply 23a, which means that the power efficiency drops due to the variation in the use environment.

Then, if the drain current decreases, an excessive drain current that is output from the power supply 23a may possibly be further reduced; therefore, the reference voltage control circuit 25 adds the predetermined value ΔV to the reference voltage setting value and sets the added reference voltage setting value in the comparator circuit 14.

In contrast, if the drain current increases, an excessive drain current that is output from the power supply 23a may possibly occur; therefore, the reference voltage control circuit 25 subtracts the predetermined value ΔV from the current reference voltage setting value and sets the subtracted reference voltage setting value in the comparator circuit 14.

Subsequently, the reference voltage control circuit 25 determines again whether the drain current measured by the drain current measuring circuit 24 increases or decreases. Then, if the drain current decreases, an excessive drain current that is output from the power supply 23a may possibly further be reduced; therefore, the reference voltage control circuit 25 subtracts the predetermined value ΔV from the current reference voltage setting value and sets the subtracted reference voltage setting value in the comparator circuit 14. In contrast, if the drain current increases, the reference voltage control circuit 25 determines the current reference voltage setting value as the optimum value and sets the determined optimum value in the comparator circuit 14.

In this way, if the drain current varies, the reference voltage control circuit 25 searches for the optimum value of the reference voltage that minimizes the drain current by gradually increasing or decreasing the reference voltage setting value and using the currently supplied reference voltage as the initial value. In other words, the reference voltage control circuit 25 dynamically searches for the optimum reference voltage that reduces an output of the excessive drain current. If the optimum reference voltage is searched by the reference voltage control circuit 25, the output power that is obtained when the voltage of the envelope becomes the reference voltage is shifted from the straight line 213 to a straight line 213a, as illustrated in FIG. 5. Accordingly, it is possible to reduce the drop in the power efficiency occurring due to the variation in the use environment to the drop amount indicated by an arrow 214a from the drop amount indicated by an arrow 214.

Figure 6:
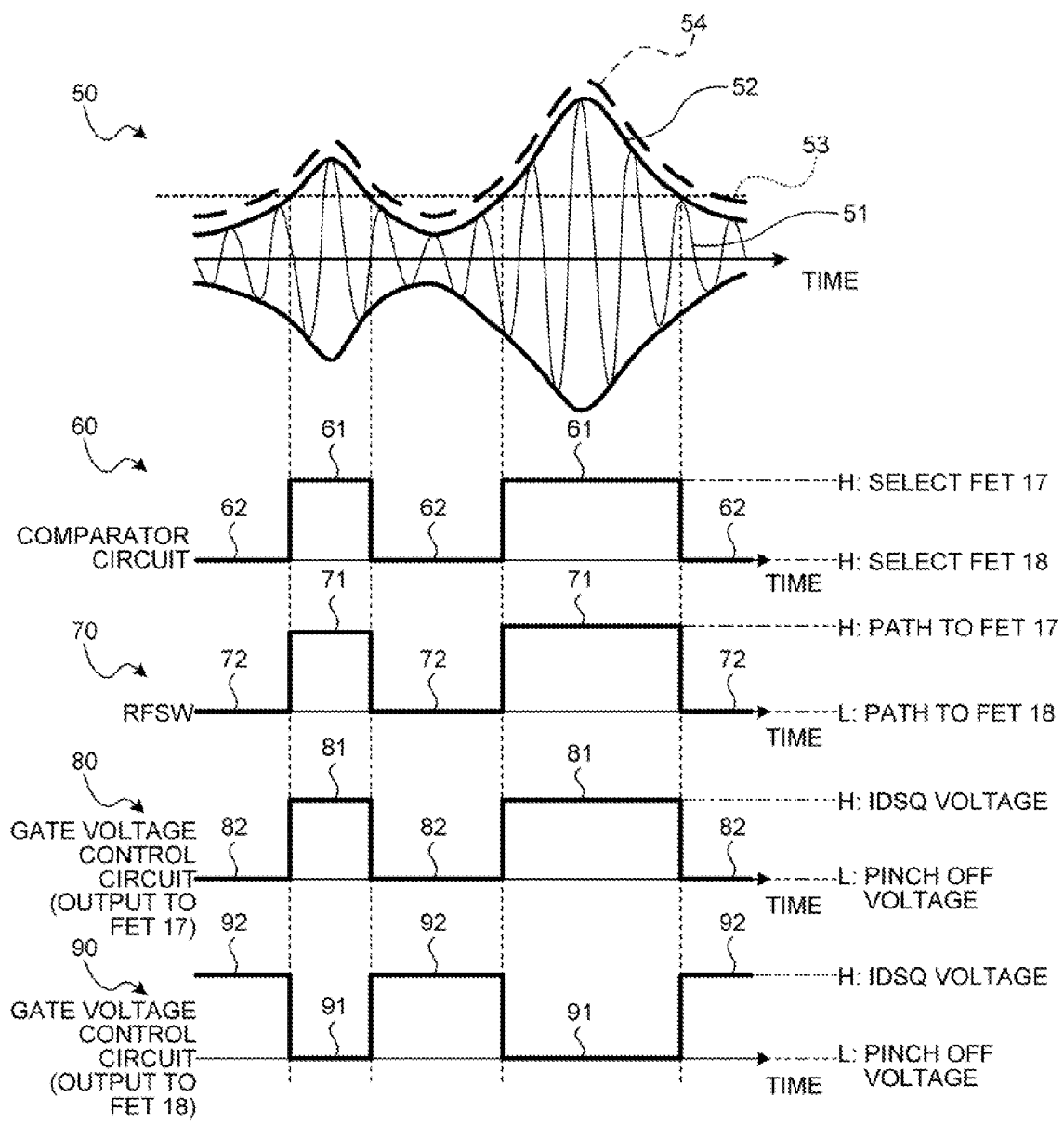
FIG. 6 is a timing chart illustrating the operation of a transmission device according to the embodiment.

In the following, the flow of the operation of the transmission device according to the embodiment will be described with reference to FIG. 6. FIG. 6 is a timing chart illustrating the operation of a transmission device according to the embodiment. FIG. 6 includes a wave form chart 50, a wave form chart 60, a wave form chart 70, a wave form chart 80, and a wave form chart 90.

The wave form chart 50 indicates a waveform of the RF signal represented on the time axis. The wave form chart 60 indicates a waveform of the output signal of the comparator circuit 14 represented on the time axis. The wave form chart 70 indicates a waveform of an internal signal of the RFSW 16 represented on the time axis. The wave form chart 80 indicates a waveform of the supply voltage with respect to the FET 17 in the gate voltage control circuit 19 represented on the time axis. The wave form chart 90 indicates a waveform of the supply voltage with respect to the FET 18 in the gate voltage control circuit 19 represented on the time axis.

As indicated by the wave form chart 50, the envelope detection circuit 13 detects an envelope 52 of an RF signal 51. Then, the comparator circuit 14 compares the voltage of the envelope 52 detected by the envelope detection circuit 13 with a reference voltage 53 controlled by the reference voltage control circuit 25.

Then, as indicated by the wave form chart 60, if the voltage of the envelope 52 is equal to or greater than the reference voltage, the comparator circuit 14 outputs, as the comparison result to the RFSW 16 and the gate voltage control circuit 19, a high signal 61 indicating that the FET 17 is to be selected. In contrast, if the voltage of the envelope 52 is less than the reference voltage 53, the comparator circuit 14 outputs, as the comparison result to the RFSW 16 and the gate voltage control circuit 19, a low signal 62 indicating that the FET 17 is to be selected.

Then, as indicated by the wave form chart 70, if the RFSW 16 obtains the high signal 61 indicating that the FET 17 is to be selected, the RFSW 16 selects the FET 17 by transmitting, to the internal switching element, a signal 71 indicating that the RF signal 51 is sent to the path connected to the FET 17. Accordingly, the RF signal 51 passes along the path connected to the FET 17. In contrast, if the RFSW 16 obtains the low signal 62 indicating that the FET 18 is to be selected, the RFSW 16 selects the FET 18 by transmitting, to the internal switching element, a signal 72 indicating that the RF signal 51 is sent to the path connected to the FET 18. Accordingly, the RF signal 51 passes along the path connected to the FET 18.

Then, as indicated by the wave form chart 80 and the wave form chart 90, if the gate voltage control circuit 19 obtains the high signal 61 indicating that the FET 17 is to be selected, the gate voltage control circuit 19 supplies, as the gate voltage to the FET 17, an Idsq voltage 81 that operates the FET 17 selected by the RFSW 16. At the same time, the gate voltage control circuit 19 supplies, as the gate voltage to the FET 18, a pinch off voltage 91 that causes the FET 18 that is not selected by the RFSW 16 to not operate.

In contrast, if the gate voltage control circuit 19 obtains the low signal 62 indicating that the FET 18 it to be selected, the gate voltage control circuit 19 supplies, as the gate voltage to the FET 18, an Idsq voltage 92 that causes the FET 18 selected by the RFSW 16 to operate. At the same time, the gate voltage control circuit 19 supplies, as the gate voltage to the FET 17, a pinch off voltage 82 that causes the FET 17 that is not selected by the RFSW 16 to not operate.

Then, as indicated by the wave form chart 50, the drain voltage control circuit 23 controls, in accordance with the envelope 52, a drain voltage 54 of the FET 17 or the FET 18 selected by the RFSW 16.

Figure 7:
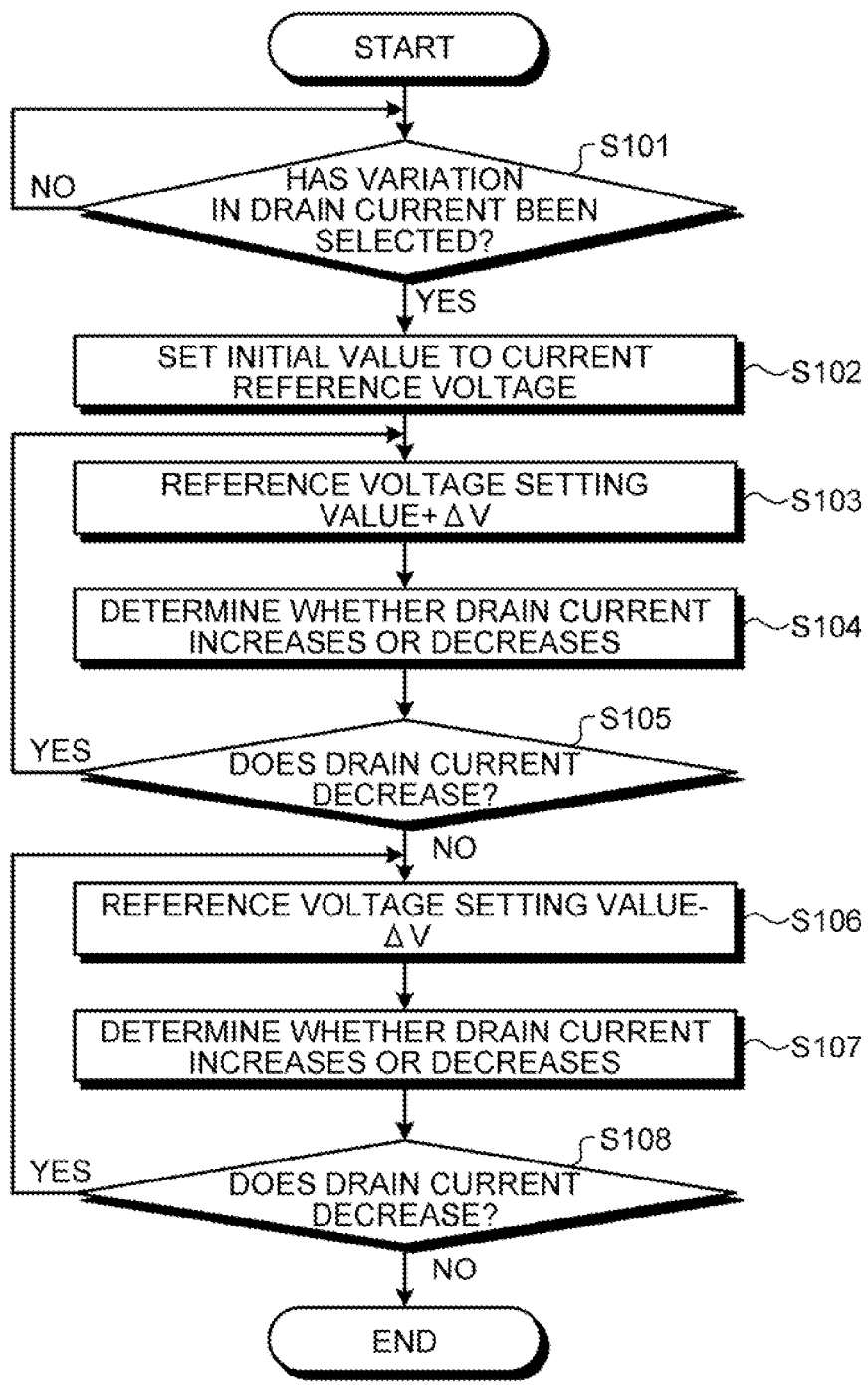
FIG. 7 is a flowchart illustrating the flow of a reference voltage control process performed by a reference voltage control circuit according to the embodiment.
Figure 8:
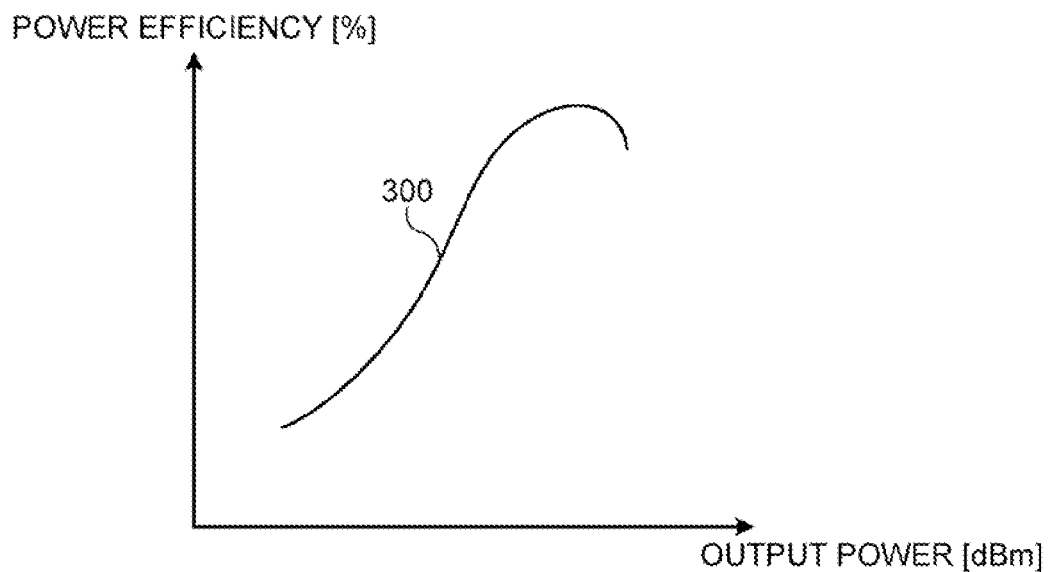
FIG. 8 is a schematic diagram illustrating a power efficiency curve of a commonly used amplifier that uses an envelope tracking system.
Figure 9:
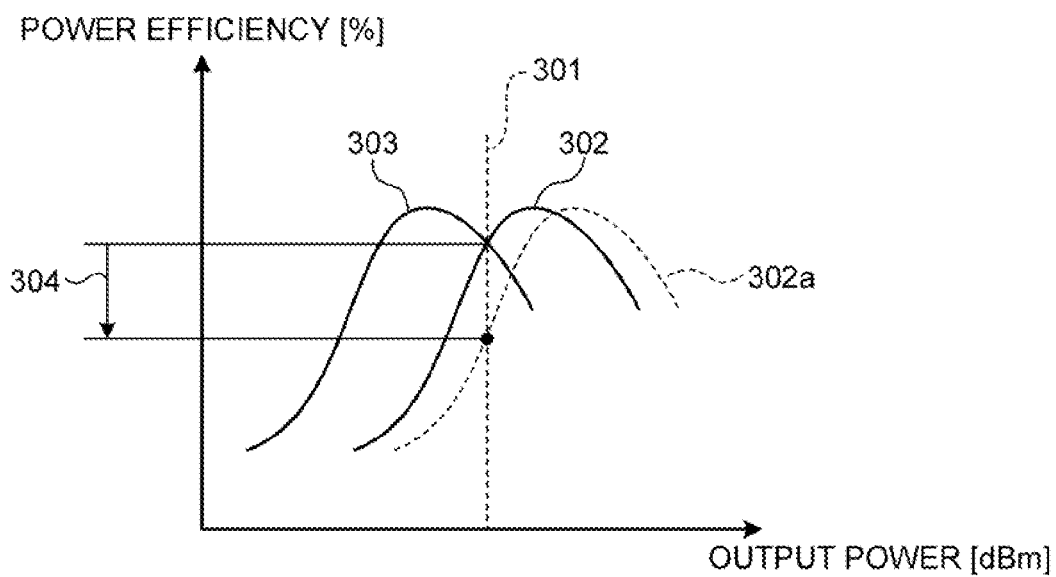
FIG. 9 is a schematic diagram illustrating a power efficiency curve of a conventional amplifier that selectively operates two amplifying elements in accordance with the voltage of an envelope of a transmission signal.

In the following, a reference voltage control process performed by the reference voltage control circuit 25 according to the embodiment will be described with reference to FIG. 7. FIG. 7 is a flowchart illustrating the flow of a reference voltage control process performed by the reference voltage control circuit 25 according to the embodiment. The reference voltage control process illustrated in FIG. 7 is periodically performed by the reference voltage control circuit 25 when the transmission device executes the operation illustrated in FIG. 6.

First, the reference voltage control circuit 25 detects the variation in the drain current measured by the drain current measuring circuit 24 (Step S101). If the reference voltage control circuit 25 does not detect the variation in the drain current measured by the drain current measuring circuit 24 (No at Step S101), the reference voltage control circuit 25 waits, instead of changing the reference voltage, without processing anything.

In contrast, if the reference voltage control circuit 25 detects the variation in the drain current measured by the drain current measuring circuit 24 (Yes at Step S101), the reference voltage control circuit 25 sets the currently supplied reference voltage as the initial value of the reference voltage setting value (Step S102).

Subsequently, the reference voltage control circuit 25 adds the predetermined value $\Delta V$ to the initial value of the reference voltage setting value and sets the added reference voltage setting value in the comparator circuit 14 (Step S103).

Subsequently, the reference voltage control circuit 25 determines whether the drain current measured by the drain current measuring circuit 24 increases or decreases (Step S104). If the drain current decreases (Yes at Step S105), the reference voltage control circuit 25 adds the predetermined value $\Delta V$ to the current reference voltage setting value and sets the added reference voltage setting value in the comparator circuit 14 (Step S103).

In contrast, if the drain current increases (No at Step S105), the reference voltage control circuit 25 subtracts the predetermined value $\Delta V$ from the current reference voltage setting value and sets the subtracted reference voltage setting value in the comparator circuit 14 (Step S106).

Subsequently, the reference voltage control circuit 25 determines again whether the drain current measured by the drain current measuring circuit 24 increases or decreases (Step S107). If the drain current decreases (Yes at Step S108), the reference voltage control circuit 25 subtracts the predetermined value $\Delta V$ from the current reference voltage setting value and sets the subtracted reference voltage setting value in the comparator circuit 14 (Step S106).

In contrast, if the drain current increases (No at Step S108), the reference voltage control circuit 25 determines the current reference voltage setting value as an optimum value and sets the optimum value in the comparator circuit 14.

As described above, when the two FETs are selectively operated in accordance with the comparison result of the voltage of the envelope and the reference voltage, the transmission device according to the embodiment measures the drain current of the selected FET and dynamically searches for the reference voltage such that the drain current decreases. Accordingly, the transmission device according to the embodiment can search for the optimum reference voltage that reduces an output of an excessive drain current occurring due to the variation in the use environment, such as a temperature change in the FETs or a variation in accuracy of parts. Therefore, the transmission device according to the embodiment can reduce the degradation of the power efficiency occurring due to the variation in the use environment.

Furthermore, when controlling the reference voltage, the transmission device according to the embodiment sets the currently supplied reference voltage as the initial value of the reference voltage setting value and searches, while gradually increasing or decreasing the value of the reference voltage, for the optimum value of the reference voltage that minimizes the drain current. Accordingly, unlike the method for dynamically searching for the value of the reference voltage in accordance with the value set at the time of configuration, the transmission device according to the embodiment can dynamically search for the optimum value of the reference voltage in accordance with the currently supplied reference voltage. Consequently, because the transmission device according to the embodiment can accurately follow the variation in the use environment, it is possible to promptly reduce the degradation of the power efficiency occurring due to the variation in the use environment.

Furthermore, the transmission device according to the embodiment supplies, as the gate voltage to another FET, the pinch off voltage that causes another FET other than the FET that is selected by the RFSW 16 to not operate. Accordingly, the transmission device according to the embodiment can causes the other FET that is not used for amplifying a signal to not operate and thus reducing the electrical power consumed by the other FET.

Furthermore, the transmission device according to the embodiment adjusts the phase of the transmission signal that is output from a non-operational FET such that the output impedance of the non-operational FET is open with respect to the operational FET. Accordingly, the transmission device according to the embodiment can prevent the signal from leaking from the non-operational FET to the operational FET.

According to an aspect of the present invention, an advantage is provided in that the amplifier disclosed in the present invention can reduce the degradation of the power efficiency occurring due to the environment factor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An amplifier comprising:
    an envelope detection unit that detects an envelope of a transmission signal;
    a comparing unit that compares a voltage of the envelope with a reference voltage;
    a selecting unit that selects, in accordance with a comparison result obtained by the comparing unit, an amplifying element that amplifies the transmission signal from among a plurality of amplifying elements each having different operating power;
    a voltage control unit that controls, in accordance with the envelope, a voltage that is used to amplify the transmission signal in the amplifying element that is selected by the selecting unit;
    a current measuring unit that measures a current of a power supply that supplies the voltage that is controlled by the voltage control unit; and
    a reference voltage control unit that controls the reference voltage such that the current measured by the current measuring unit decreases.

2. The amplifier according to claim 1, wherein, when the current measured by the current measuring unit varies, the reference voltage control unit controls the reference voltage by setting a currently supplied reference voltage as an initial value and by searching for an optimum reference voltage that minimizes the current while gradually increasing or decreasing the currently supplied reference voltage.

3. The amplifier according to claim 1, further comprising an on-off voltage control unit that supplies a voltage, which causes the amplifying element selected by the selecting unit from among the amplifying elements to operate, to the amplifying element in accordance with the comparison result obtained by the comparing unit and that supplies a voltage, which causes another amplifying element other than the amplifying element that is selected by the selecting unit not to operate, to the other amplifying element in accordance with the comparison result obtained by the comparing unit.

4. The amplifier according to claim 3, further comprising a phase adjustment unit that adjusts a phase of a transmission signal that is output from the non-operational amplifying element which is caused by the on-off voltage control unit not to operate such that an output impedance of the non-operational amplifying element is open with respect to the amplifying element that is caused by the on-off voltage control unit to operate.

5. A transmission device comprising:
    a transmission signal generating unit that generates a transmission signal;
    an envelope detection unit that detects an envelope of the transmission signal;
    a comparing unit that compares a voltage of the envelope with a reference voltage;
    a selecting unit that selects, from among a plurality of amplifying elements each having different operating power and in accordance with a comparison result obtained by the comparing unit, an amplifying element that amplifies the transmission signal;
    a voltage control unit that controls, in accordance with the envelope, a voltage that is used to amplify the transmission signal in the amplifying element that is selected by the selecting unit;
    a current measuring unit that measures a current of a power supply that supplies the voltage that is controlled by the voltage control unit; and a reference voltage control unit that controls the reference voltage such that the current measured by the current measuring unit decreases.

6. An amplifier control method that is executed by an amplifier, the amplifier control method comprising:

detecting an envelope of a transmission signal;

comparing a voltage of the envelope with a reference voltage;

selecting, in accordance with a comparison result at the comparing, an amplifying element that amplifies the transmission signal from among a plurality of amplifying elements each having different operating power;

controlling, in accordance with the envelope, a voltage that is used to amplify the transmission signal in the amplifying element selected at the selecting;

measuring a current of a power supply that supplies the voltage that is controlled at the controlling; and controlling the reference voltage such that the current measured at the measuring decreases.

* * * * *